US012635512B2

(12) United States Patent
Ding et al.

(10) Patent No.: US 12,635,512 B2
(45) Date of Patent: May 19, 2026

(54) SEMICONDUCTOR STRUCTURE AND FABRICATION METHOD THEREOF

(71) Applicants: Semiconductor Manufacturing International (Tianjin) Corporation, Tianjin (CN); Semiconductor Manufacturing International (Shanghai) Corporation, Shanghai (CN)

(72) Inventors: Ya Ding, Tianjin (CN); Jinsong Wang, Tianjin (CN); Linhong Yang, Tianjin (CN); Yanhong Zhang, Tianjin (CN); Yichen Du, Tianjin (CN); Qiuying Chen, Tianjin (CN)

(73) Assignees: Semiconductor Manufacturing International (Tianjin) Corporation, Tianjin (CN); Semiconductor Manufacturing International (Shanghai) Corporation, Shanghai (CN)

( * ) Notice: Subject to any disclaimer, the term of this patent is extended or adjusted under 35 U.S.C. 154(b) by 468 days.

(21) Appl. No.: 18/202,131

(22) Filed: May 25, 2023

(65) Prior Publication Data

US 2023/0395508 A1 Dec. 7, 2023

(30) Foreign Application Priority Data

Jun. 1, 2022 (CN) .......................... 202210618451.6

(51) Int. Cl.
| | |
|---|---|
| *H01L 23/532* | (2006.01) |
| *H10D 1/68* | (2025.01) |
| *H10W 20/00* | (2026.01) |
| *H10W 20/40* | (2026.01) |
| *H10W 20/47* | (2026.01) |

(52) U.S. Cl.
CPC ............ *H10W 20/47* (2026.01); *H10D 1/692* (2025.01); *H10W 20/075* (2026.01); *H10W 20/077* (2026.01); *H10W 20/496* (2026.01)

(58) Field of Classification Search
CPC ......... H01L 23/53295; H01L 21/76832; H01L 21/76834; H01L 23/5223; H10D 1/692
See application file for complete search history.

(56) References Cited

U.S. PATENT DOCUMENTS

2022/0139795 A1* 5/2022 Yamaguchi ......... H01L 23/3192
257/532

* cited by examiner

*Primary Examiner* — Karen Kusumakar
(74) *Attorney, Agent, or Firm* — Anova Law Group, PLLC

(57) ABSTRACT

A semiconductor structure includes a substrate, a first electrode plate over the substrate, a second electrode plate over the first electrode plate, and a sidewall structure. The sidewall structure is attached to a side of the second electrode plate. A dielectric constant of the sidewall structure decreases in a direction away from the second electrode plate.

20 Claims, 6 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202210618451.6, filed on Jun. 1, 2022, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

Digital isolators are core safety components in industrial automation systems. Digital isolators transfer data and energy between high voltage and low voltage in a non-contact manner, while blocking the passage of dangerous currents and protecting the personnel and equipment. Current digital isolators are mainly based on two isolation methods: electromagnetic coupling and capacitive coupling. Among the digital isolators, capacitively coupled digital isolators have a small size, high integration, low power consumption, and high communication speed, and are used widely in fields such as manufacturing, medical devices, and automobiles. However, the performance of current capacitively coupled digital isolators still needs to be improved.

The disclosed structures and methods are directed to at least partially alleviate one or more problems set forth above and to solve other problems in the art.

SUMMARY

One aspect of the present disclosure provides a semiconductor structure that includes a substrate, a first electrode plate over the substrate, a second electrode plate, and a sidewall structure. The second electrode plate is over, parallel to, and aligned in a first direction perpendicular to the substrate with the first electrode plate. The sidewall structure is attached to a side of the second electrode plate. A dielectric constant of the sidewall structure decreases in a second direction away from the second electrode plate.

Another aspect of the present disclosure provides a method for forming a semiconductor structure. The method includes providing a substrate, forming a first electrode plate over the substrate, forming a second electrode plate over the first electrode plate, and forming a sidewall structure. The second electrode plate is parallel to and aligned in a first direction perpendicular to the substrate with the first electrode plate. The sidewall structure is attached to a side of the second electrode plate. A dielectric constant of the sidewall structure decreases in a second direction away from the second electrode plate.

Another aspect of the present disclosure provides a semiconductor structure that includes a substrate, a first electrode plate over the substrate, a second electrode plate, and a dielectric sidewall structure. The second electrode plate is over, parallel to, and aligned in a first direction perpendicular to the substrate with the first electrode plate. A width and a length of the second electrode plate are larger than a width and a length of the first electrode plate by predetermined values, respectively. A dielectric sidewall structure is attached to a side of the second electrode plate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Spatially relative terms, such as "on," "above," and "over" in the present disclosure, may be used to describe the relative positional relationship of space, not limited to direct contact or no direct contact. For example, the term "on" not only indicates "directly on" something but also includes the meaning of "on" something with an intermediate feature or a layer therebetween. The terms "above" or "over" not only indicates the meaning of "above" or "over" something but also means it is "above" or "over" something with no intermediate feature or layer therebetween (i.e., directly on something).

Figure 1:
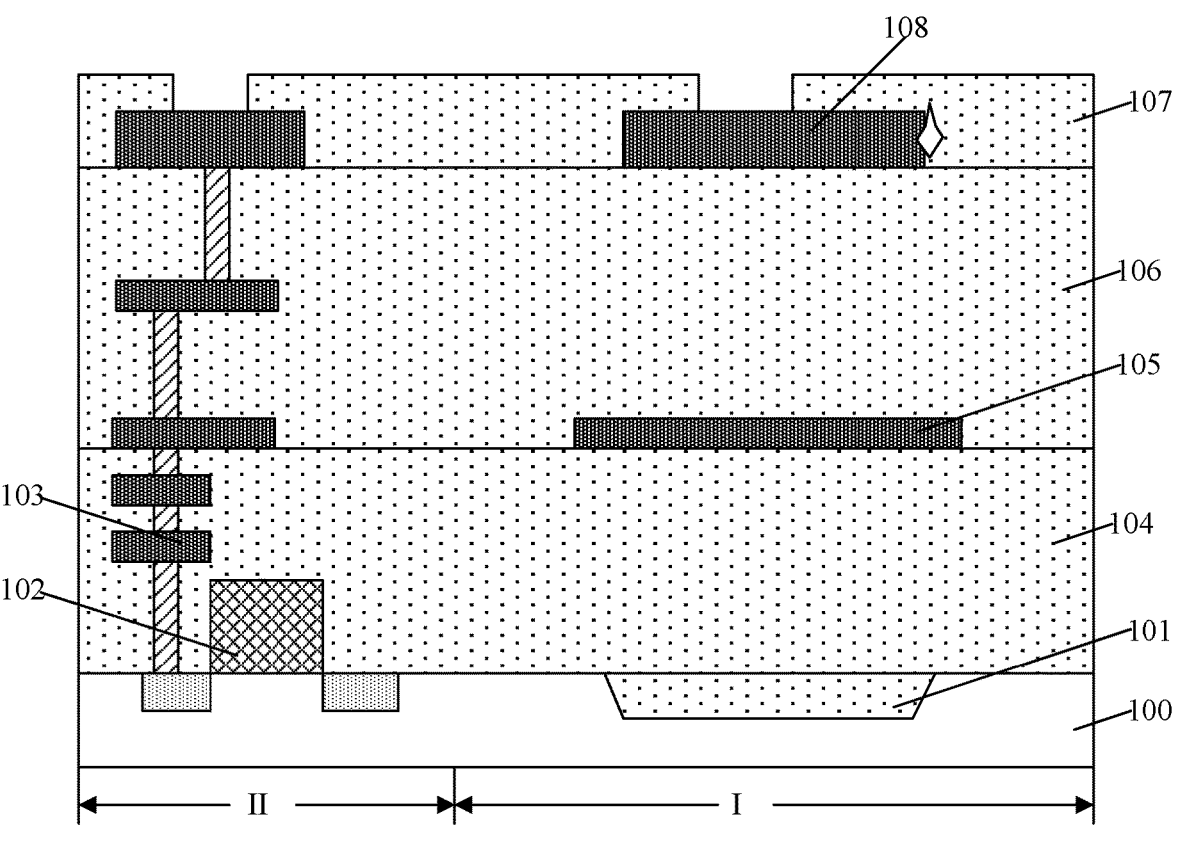
FIG. 1 illustrates a cross-sectional view of a semiconductor structure.

FIG. 1 shows a cross-sectional view of a semiconductor structure for making capacitively coupled digital isolators. The semiconductor structure includes a substrate 100. The substrate 100 has an isolation region I and device region II. An isolation structure 101 is in the isolation region I of the substrate 100. A device structure 102 is over the device region II. An interconnection structure 103 is electrically connected to the device structure 102. A first dielectric structure 104 is above the substrate 100, and the device structure 102 is in the first dielectric structure 104. A first electrode plate 105 is above the first dielectric structure 104 and over the isolation region I. A second dielectric structure 106 is over the first electrode plate 105. A second electrode plate 108 is over the second dielectric structure 106 and over the isolation region I. The projected area of the second electrode plate 108 on the substrate 100 partially or completely overlaps with the projected area of the first electrode plate 105 on the substrate 100. A passivation layer 107 is over the second electrode plate 108. The passivation layer 107 is configured such that part of the top surface of the second electrode plate 108 is exposed. The interconnection structure 103 is in the first and second dielectric structures 104 and 106 and the passivation layer 107.

Part of the semiconductor structure over the isolation region I may be considered as a structure of a capacitively coupled high-voltage isolator. The main structure of the capacitively coupled high-voltage isolator includes a parallel plate capacitor. The capacitor contains the first and second electrode plates 105 and 108 as the bottom and top electrode plates. The second dielectric structure 106 as the main dielectrics fills the space between the first and second electrode plates 105 and 108 with insulating materials. Research on the structure of high-voltage capacitors is often focused on the electrode plates and interlayer dielectrics between the electrode plates. However, we found that the strongest electric field is around the side of the electrode plate, such as the side region of the second electrode plate 108. Hence, the side region of the second electrode plate 108 may become a weak point of a high-voltage capacitor. The breakdown of the capacitor primarily occurs at the side region of the second electrode plate 108 in the passivation layer 107. For example, the second electrode plate 108 often has a cuboid shape, and its thickness (or height) is usually much smaller than its bottom dimensions such as the width and length. When a voltage is applied on the second electrode plate 108, the electrical field diverges outward. The electrical field intensity is higher at the side region of second electrode plate 108 compared to that at other regions.

Therefore, improving the breakdown resistance of the passivation layer at the side of the electrode plate and reducing the leakage current are of great significance for broadening the application field of capacitively coupled isolators. Thus, it is desirable to improve the passivation layer at the side of the electrode plate to increase the breakdown voltage and reduce leakage currents.

In order to solve above problems, a semiconductor structure and a method for making the semiconductor structure are provided. For example, a sidewall structure may be configured at the side region of the second electrode plate. Then, a passivation layer may be formed on the sidewall structure and over the second dielectric structure. The dielectric constant of the sidewall structure is larger than that of the passivation layer. The electrical field intensity in the dielectric material at the side region of the second electrode plate is distributed according to the dielectric constant of the dielectric material. That is, the product of the electrical field intensity and the dielectric constant in the sidewall structure is equal to that in the passivation layer. As the dielectric constant of the sidewall structure is greater than that of the passivation layer, the electrical field intensity in the sidewall structure is smaller than that in the passivation layer. Thus, the high electrical field intensity at the side region of the second electrode plate may be effectively weakened, and the breakdown risk may be mitigated.

Figure 2:
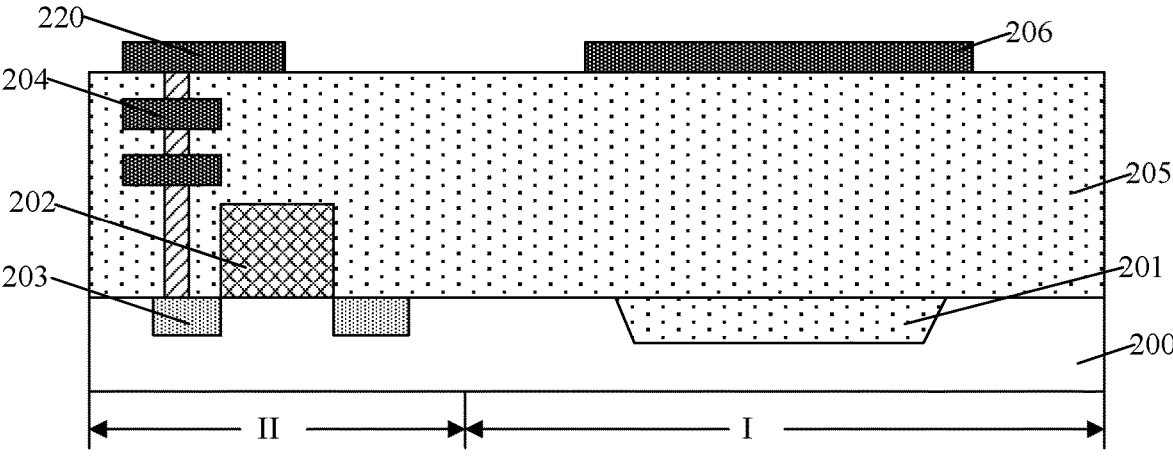
FIGS. 2-7 illustrate cross-sectional views corresponding to certain fabrication stages for forming an exemplary semiconductor structure according to various disclosed embodiments.

FIGS. 2-7 show cross-sectional views of an exemplary semiconductor structure corresponding to certain stages of a fabrication process according the present disclosure. The semiconductor structure may be used to make capacitively coupled digital isolators. Referring to FIG. 2, the semiconductor structure includes a substrate that has a base 200, an isolation region I, and a device region II. Part of the base 200 is in the isolation region I and includes an isolation structure 201. A second dielectric structure 205 is over the base 200. A device structure is above the device region II and in the second dielectric structure 205. A first electrical interconnection structure 204 is over the device structure and electrically connected to the device structure. The first electrical interconnection structure 204 includes certain metal layers and interconnection plugs between the metal layers. The device structure includes a gate structure 202 over the device region II. Doped source and drain regions 203 are in the base 200 and on both sides of the gate structure 202. The first electrical interconnection structure 204 is electrically connected with the doped source and drain regions 203.

In some embodiments, the base 200 may contain single crystalline silicon. Optionally, the base 200 may contain polycrystalline silicon or amorphous silicon. In some other cases, the base 200 may contain other semiconductor materials such as SiC, SiGe, semiconductor materials composed of III-V group elements, silicon-on-insulator (SOI), or germanium-on-insulator (GOI). The semiconductor materials composed of III-V group elements may include InP, GaAs, GaP, InAs, InSb, InGaAs, or InGaAsP.

The material of the second dielectric structure 205 may contain one or more dielectric materials that include silicon oxide, silicon nitride, silicon carbide, silicon oxycarbide, silicon oxynitride, aluminum oxide, aluminum nitride, silicon carbide nitride, or silicon oxycarbonitride, or any combination thereof. In descriptions below, the exemplary material of the isolation structure 201 and the second dielectric structure 205 includes silicon oxide.

As shown in FIG. 2, a first electrode plate 206 is formed over the second dielectric structure 205 and the isolation region I. The material of the first electrode plate 206 includes a metallic material such as aluminum or aluminum-copper alloy. In some cases, the thickness of the first electrode plate 206 may range from 0.3 to 2 microns.

A first metal layer 220 is deposited over the second dielectric structure 205 and the device region II. In some embodiments, the first electrode plate 206 and first metal layer 220 may be formed concurrently. Optionally, the height of the first electrode plate 206 is equal to that of the first metal layer 220.

Figure 3:
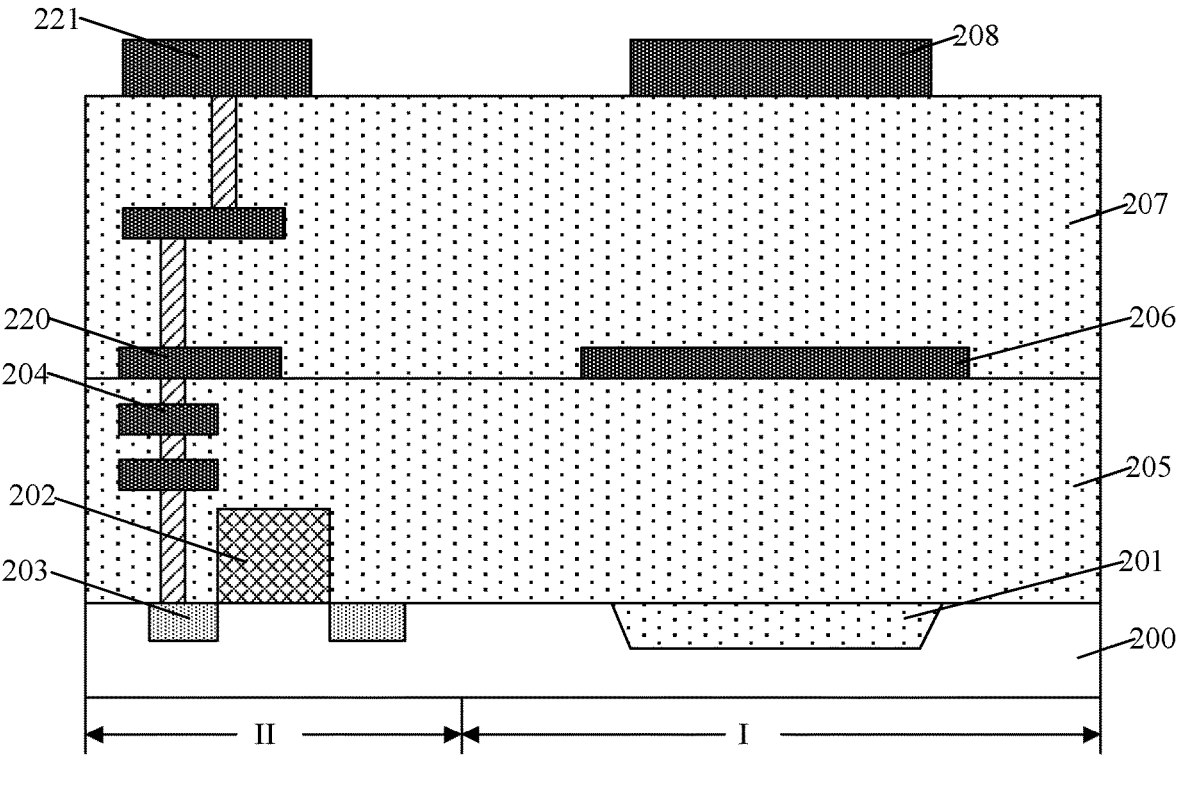

Referring to FIG. 3, a first dielectric structure 207 is formed over the first electrode plate 206 and one or more interconnection structures (e.g., the first electrical interconnection structure 204 and/or first metal layer 220). The first dielectric structure 207 serves as a dielectric material that fills the space between the first electrode plate 206 and a subsequently formed second electrode plate. A capacitive structure is formed by the first and second electrode plates and the first dielectric structure 207 between the first and second electrode plates. The first dielectric structure 207 contains one or more dielectric materials that include silicon oxide, silicon nitride, silicon carbide, silicon oxycarbide, silicon oxynitride, aluminum oxide, aluminum nitride, silicon carbide nitride, or silicon oxycarbonitride, or any combination thereof. In descriptions below, the exemplary material of the first dielectric structure 207 includes silicon oxide.

In the process of forming the first dielectric structure 207, a second electrical interconnection structure is made in the first dielectric structure 207. The second electrical interconnection structure is electrically connected to the first metal layer 220.

As shown in FIG. 3, a second electrode plate 208 is made on the first dielectric structure 207 over the isolation region I. The projected area of the second electrode plate 208 on the substrate partially or completely overlaps with the projected area of the first electrode plate 206 on the substrate, which ensures the capacitive structure made by the first and second electrode plates 206 and 208 and the first dielectric structure 207.

In some embodiments, the thickness of the second electrode plate 208 is larger than that of the first electrode plate 206. The breakdown voltage may be increased because of the thickness of the second electrode plate 208. In some cases, the thickness of the second electrode plate 208 may range from 0.9 to 5 microns. The material of the second electrode plate 208 includes a metallic material such as aluminum or aluminum-copper alloy.

A second metal layer 221 is deposited over the first dielectric structure 207 and the device region II. In some embodiments, the second electrode plate 208 and second metal layer 221 may be formed concurrently. Optionally, the second electrode plate 208 and second metal layer 221 have the same height value. The second metal layer 221 is electrically connected to the second electrical interconnection structure.

Figure 4:
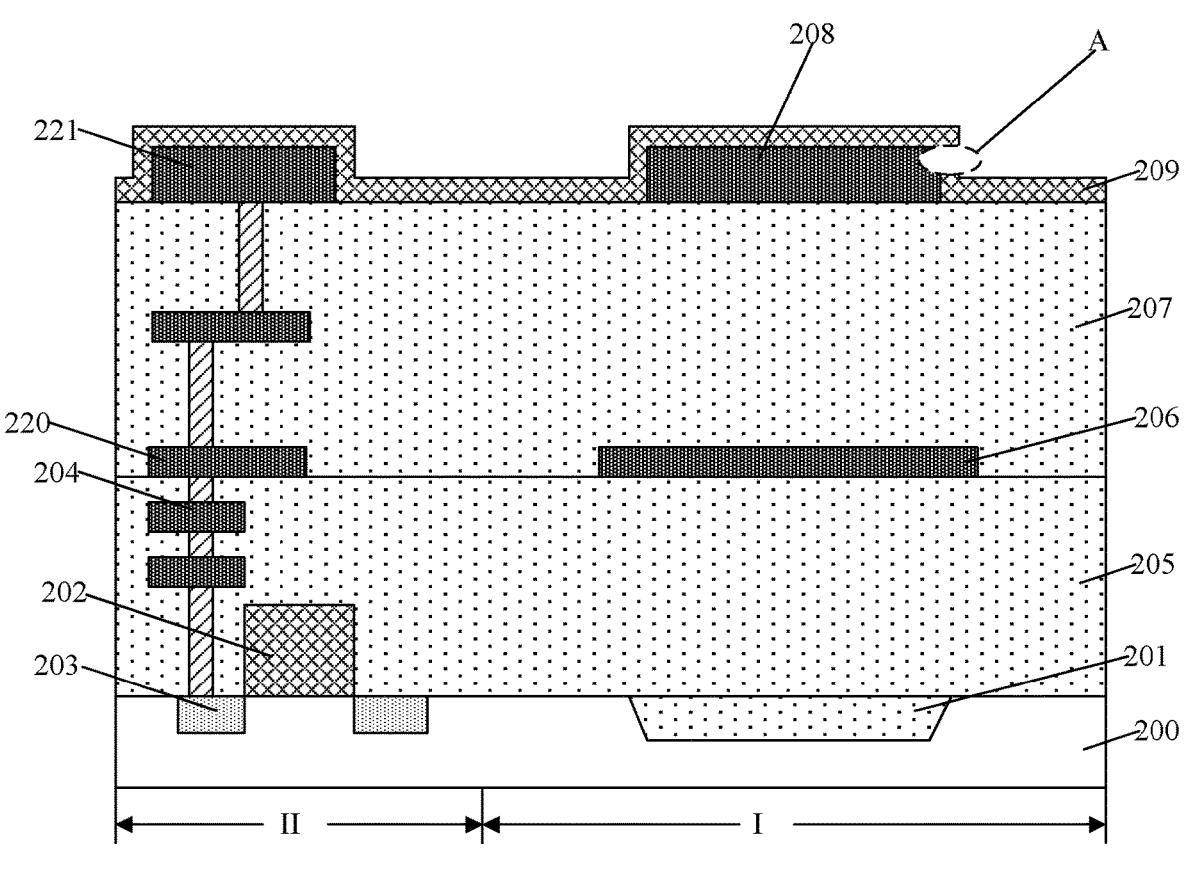
Figure 5:
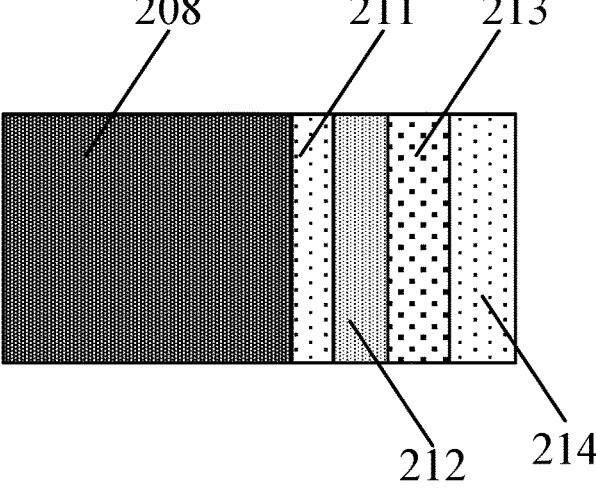

FIGS. 4-7 show an exemplary process to fabricate a sidewall structure for the second electrode plate 208 according to the present disclosure. FIG. 5 is an enlarged schematic view of an area A shown in FIG. 4. A dielectric adhesive material layer 211 is deposited on the first dielectric structure 207 and the side and top surfaces of the second electrode plate 208. The adhesive material layer 211 is used for adhesion between subsequently formed layers of the sidewall structure and the second electrode plate 208. The adhesive material layer 211 may improve the bonding between the layers of the sidewall structure and the second electrode plate 208 when the dielectric constant of the sidewall structure is high.

In descriptions below, the material of the adhesive material layer 211 includes silicon oxide. The adhesive material layer 211 may be made through a deposition process in some embodiments. Alternatively, the adhesive material layer 211 may not be configured on the side of the second electrode plate 208 in some cases.

As shown in FIG. 4-5, sidewall structural material layers are formed on the surface of the adhesive material layer 211. The sidewall structural material layers may include a first, second, and third dielectric material layers 212, 213, and 214 that are formed sequentially. That is, the layer 212 is made first, followed by the layer 213 made on the surface of the layer 212 and the layer 214 made on the surface of the layer 213. The first to third dielectric material layers 212-214 are used to subsequently form a sidewall structure. From the layer 212 to layer 214, the corresponding dielectric constant of the dielectric material layers decreases sequentially. In some cases, there may be more than three dielectric material layers. In some other cases, there may be fewer than three dielectric material layers. In the latter scenario, there may be at least one dielectric material layer formed at the side region of the second electrode plate 208.

The dielectric constant of the dielectric material layers 212-214 may range from 4 to 50 in some cases. The material of the dielectric material layers 212-214 may include two or more elements of nitrogen, silicon, carbon, and oxygen. In some cases, the material of the dielectric material layers may include silicon carbide, silicon nitride, or silicon oxynitride. In some cases, the material of the sidewall structural material layer may include one or more of silicon carbide, silicon nitride, and silicon oxynitride.

In some cases, the thickness range of any dielectric material layer (e.g., one of the layers 212-214) may be 10% to 30% of the thickness of the second electrode plate 208. As such, when a subsequent voltage is applied to the second electrode plate 208, the electrical filed intensity may be evenly distributed through the sidewall structure at the edge region of the second electrode plate 208, reducing the breakdown risk. Optionally, the dielectric material layers 212-214 may be formed by a deposition method.

In some embodiments, the sidewall structural material layer includes a single dielectric material layer. Along a direction away from the side of the second electrode plate

208, the dielectric constant of the single dielectric material layer decreases, e.g., gradually or with a predetermined pattern. Processes such as a deposition process may be performed to make the single dielectric material layer. By adjusting process parameters such as gas ratio during the deposition process, the dielectric constant of the single dielectric material layer may be controlled.

Figure 6:
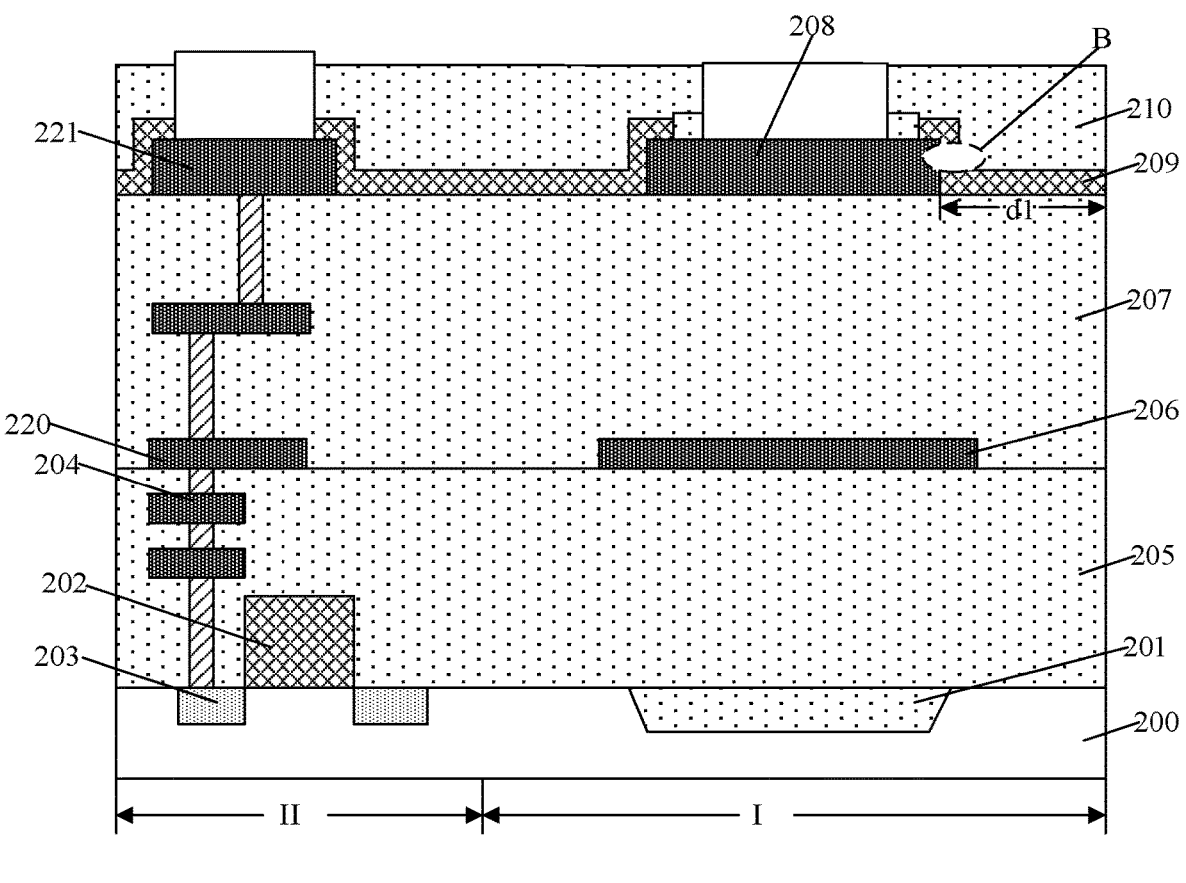
Figure 7:
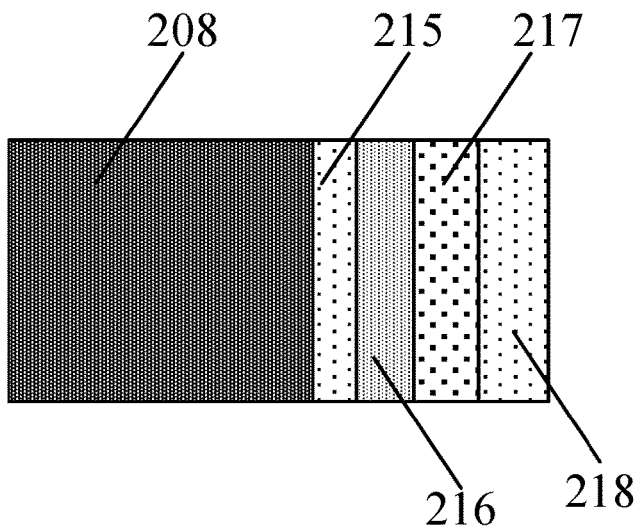

As shown in FIG. 6, a process such as an etch process is performed to remove part of the adhesive material layer 211 and sidewall structural material layers on the second electrode plate 208 and the second metal layer 221. Referring to FIG. 7 that is an enlarged schematic diagram of an area B shown in FIG. 6, an adhesive layer 215 is formed on the side surface of the second electrode plate 208, and a sidewall structure is formed on the adhesive layer 215. The sidewall structure includes a first part and a second part. The first part is on the side surface of the second electrode plate 208, and the second part is on the surface of the first dielectric structure 207.

The extension length of the second part on the surface of the first dielectric structure 207 is greater than or equal to twice the thickness of the second electrode plate 208. As such, on the one hand, the second part may enhance the bonding stability between the sidewall structure and the second electrode plate 208, and on the other hand, the high electrical field intensity created at the side region of the second electrode plate 208 may be reduced. Optionally, the first part is also formed on part of the top surface of the second electrode plate 208.

The sidewall structure may include multiple dielectric layers in some aspects. As shown in FIG. 7, the sidewall structure may include a first dielectric layer 216, a second dielectric layer 217, and a third dielectric layer 218. The first dielectric layer 216 is formed on the surface of the adhesive layer 215. The second dielectric layer 217 is formed on the surface of the first dielectric layer 216. The third dielectric layer 218 is formed on the surface of the second dielectric layer 217. A layer 209 shown in FIG. 6 may represent layers 215-218 collectively.

The dielectric constant of the sidewall structure may be distributed in a gradient in some cases. For example, from the first to third dielectric layers 216-218, the corresponding dielectric constant may decrease sequentially along a direction away from the side of the second electrode plate 208. Thus, when a voltage is applied to the second electrode plate 208, the electrical field intensity may be distributed in the dielectric layers 216-218 at the edge region of the second electrode plate 208. The breakdown voltage may be increased.

Optionally, the sidewall structure may include a single dielectric layer. The dielectric constant of the single dielectric layer may decrease (e.g., gradually or in a certain pattern) along a direction away from the side of the second electrode plate 208.

As shown in FIG. 6, a passivation layer 210 is formed over the sidewall structure and the first dielectric structure 207. The passivation layer 210 is patterned such that part of the top surface of the second electrode plate 208 is exposed. The dielectric constant of the sidewall structure is greater than that of the passivation layer 210. The dielectric constant of the sidewall structure decreases gradually from the surface of the second electrode plate 208 (or from the surface of the adhesive layer 215) to the surface of the passivation layer 210. The dielectric constant of any of the dielectric layers 216-218 is greater than that of the passivation layer 210.

The materials of the passivation layer 210 and the sidewall structure are dielectric materials. The electrical field intensity in the dielectric material at the edge region of the second electrode plate 208 is distributed according to the dielectric constant of the dielectric material. That is, the product of the electrical field intensity and the dielectric constant in the sidewall structure is equal to that in the passivation layer 210. As the dielectric constant of the sidewall structure is greater than that of the passivation layer 210, the electric field intensity in the sidewall structure is smaller than that in the passivation layer 210. Therefore, the high electrical field intensity at the side region of the second electrode plate 208 may be weakened. The breakdown risk at the side region of the second electrode plate 208 may be decreased.

Further, the sidewall structure may include multiple dielectric layers, and the dielectric constant of the dielectric layers decreases layer by layer from the surface of the second electrode plate 208 to the surface of the passivation layer 210. The product of the electrical field intensity and the dielectric constant in any of the dielectric layers of the sidewall structure is equal. The dielectric constant of the dielectric layers of the sidewall structure decreases sequentially. Thus, in the direction away from the side of the second electrode plate 208, the electrical field intensity in the dielectric layers increases sequentially. By adjusting the gradient change of the dielectric constant of the dielectric layers, the electrical field intensity at the side region of the second electrode plate 208 may be adjusted precisely. The distribution of the electrical field intensity may be optimized at the side region of the second electrode plate 208. Weak points of breakdown may be improved or eliminated, thereby improving the capability to withstand high voltage of the capacitive isolator.

In some embodiments, the sidewall structure includes a single dielectric layer. The dielectric constant of the single dielectric layer decreases gradually from the surface of the second electrode plate 208 to the surface of the passivation layer 210. Thus, in the direction away from the side of the second electrode plate 208, the electrical field intensity in the single dielectric layer increases gradually. By adjusting the gradient change of the dielectric constant of the single dielectric layer, the electrical field intensity at the side region of the second electrode plate 208 may be adjusted precisely. The distribution of the electrical field intensity may be optimized at the side region of the second electrode plate 208. Weak points of breakdown may be improved or eliminated, and the capability to withstand high voltage of the capacitive isolator may be improved.

In descriptions below, the material of the passivation layer 210 includes silicon oxide. Optionally, the electrical interconnection structure 204 is under the passivation layer 210.

FIGS. 6 and 7 also illustrate an exemplary semiconductor structure for making capacitively coupled digital isolators. The semiconductor structure includes the substrate, the first metal layer 220, first electrode plate 206, first dielectric structure 207, second electrode plate 208, sidewall structure, and passivation layer 210. The substrate includes the isolation region I and device region II. The first metal layer 220 is over the device region II. The first electrode plate 206 is above the isolation region I. Optionally, the first electrode plate 206 and first metal layer 220 may be made concurrently. The first dielectric structure 207 is above the first electrode plate 206 and first metal layer 220. The second electrode plate 208 is over the first dielectric structure 207. The projected area of the second electrode plate 208 on the substrate partially or completely overlaps with the projected area of the first electrode plate 206 on the substrate. The sidewall structure is at and attached to the side of the second electrode plate 208. The dielectric constant of the sidewall structure is distributed with a gradient pattern. The passivation layer 210 is over the sidewall structure and the first dielectric structure 207. The dielectric constant of the sidewall structure is greater than that of the passivation layer 210. In some cases, the dielectric constant of the sidewall structure decreases gradually from the surface of the second electrode plate 208 to the surface of the passivation layer 210.

In some cases, the sidewall structure includes multiple dielectric layers. The dielectric constant of the multiple dielectric layers decreases layer by layer from the surface of the second electrode plate 208 to the surface of the passivation layer 210. In some cases, the sidewall structure includes a single dielectric layer. The dielectric constant of the single dielectric layer gradually decreases from the surface of the second electrode plate 208 to the surface of the passivation layer 210. Optionally, the dielectric constant of any of the dielectric layers is greater than that of the passivation layer 210. Optionally, the sidewall structure may have one or more dielectric layers. Optionally, the thickness range of any of the dielectric layers is 10% to 30% of the thickness of the second electrode plate 208. Optionally, the material of the sidewall structure includes two or more of nitrogen, silicon, carbon, and oxygen element. Optionally, the material of the sidewall structure includes silicon carbide, silicon nitride, or silicon oxynitride.

Optionally, the sidewall structure includes a first part and a second part. The first part is on the side surface of the second electrode plate 208, and the second part is over the surface of the first dielectric structure 207. Optionally, the extension length d1 of the second part on the surface of the first dielectric structure 207 is greater than or equal to twice the thickness of the second electrode plate 208. The first portion is also on part of the top surface of the second electrode plate 208.

Optionally, the semiconductor structure further includes the adhesive layer 215 at the side of the second electrode plate 208. The sidewall structure is formed on the adhesive layer 215. In some cases, the material of the adhesive layer 215 includes silicon oxide. Optionally, the dielectric constant of the sidewall structure ranges from 4 to 50. Optionally, the thickness of the second electrode plate 208 is greater than the thickness of the first electrode plate 206. For example, the thickness of the second electrode plate 208 may range from 0.9 to 5 microns, and the thickness of the first electrode plate 206 may range from 0.3 to 2 microns. Optionally, the material of the passivation layer 210 includes silicon oxide. Optionally, the material of the first and second electrode plates 206 and 208 includes metal, such as aluminum or aluminum-copper alloy.

In some embodiments, the substrate includes the base 200. The base 200 has an isolation structure 201 in the isolation region I. The second dielectric structure 205 is over the base 200. The first electrode plate 206 is above the second dielectric structure 205. The device structure and first electrical interconnection structure 204 are in the second dielectric structure 205 and over the device region II. The first electrical interconnection structure 204 is above the device structure and electrically connected to the device structure. The second electrical interconnection structure is in the first dielectric structure 207 and over the device region II. The second electrical interconnection structure is electrically connected to the first metal layer 220. The second metal layer 221 is above the first dielectric structure 207. The second metal layer 221 is electrically connected with the second electrical interconnection structure.

Figure 8:
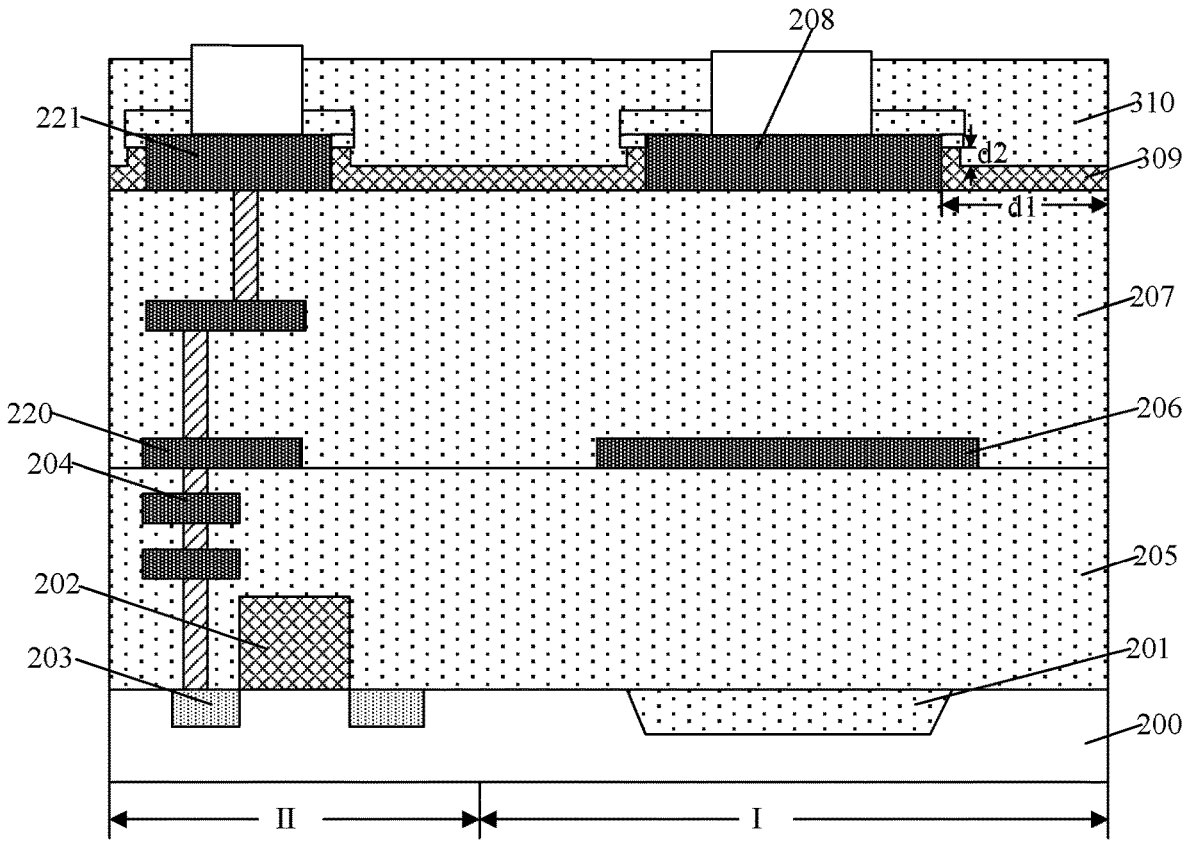
FIG. 8 illustrates a cross-sectional view of another exemplary semiconductor structure at a certain fabrication stage according to various disclosed embodiments.

FIG. 8 shows a cross-sectional view of another exemplary semiconductor structure at a certain stage of a fabrication process according to the present disclosure. FIG. 8 illustrates a schematic structural diagram based on FIG. 4. The difference between the structures in FIGS. 6 and 8 is that the top surface of the first part is lower than the top surface of the second electrode plate 208 as shown in FIG. 8. The layer 209 shown in FIG. 6 becomes a layer 309 as shown in FIG. 8 that may represent the layers 215-218 collectively. In some embodiments, the range of the height d2 of the first part is greater than or equal to 50% of the thickness of the second electrode plate 208. If the height of the first part is too low, the effect of improving the distribution of the electric field intensity at the side region of the second electrode plate 208 may be limited.

In some cases, the first and second electrode plates 206 and 208 shown in FIG. 6 may be arranged such that second electrode plate 208 has larger horizontal dimensions. For example, the centers of the plates 206 and 208 may be aligned along a direction perpendicular to the substrate. The width and length of the plate 208 may be larger than that of the plate 206 by certain values (e.g., at least 20-50% larger), respectively. When the horizontal sizes of the plate 208 are larger enough than that of the plate 206, the distribution of the high electrical field intensity may be arranged primarily below the bottom surface of the plate 208. Thus, the intensity of the electrical field at the side region of the plate 208 may be reduced. Such a method may be combined with the embodiments as shown in FIGS. 1, 6, and 8. For example, the width and length of the second electrode plate 208 (or 108) may be larger than those of the first electrode plate 206 (or 105) by certain values, respectively, reducing the electrical field intensity at the side region of the second electrode plate 208 (or 108). The width and length of the second electrode plate may be determined by the width and length of the first electrode plate, the thickness of the second electrode plate, the spacing between the first and second electrode plates, etc.

Figure 9:
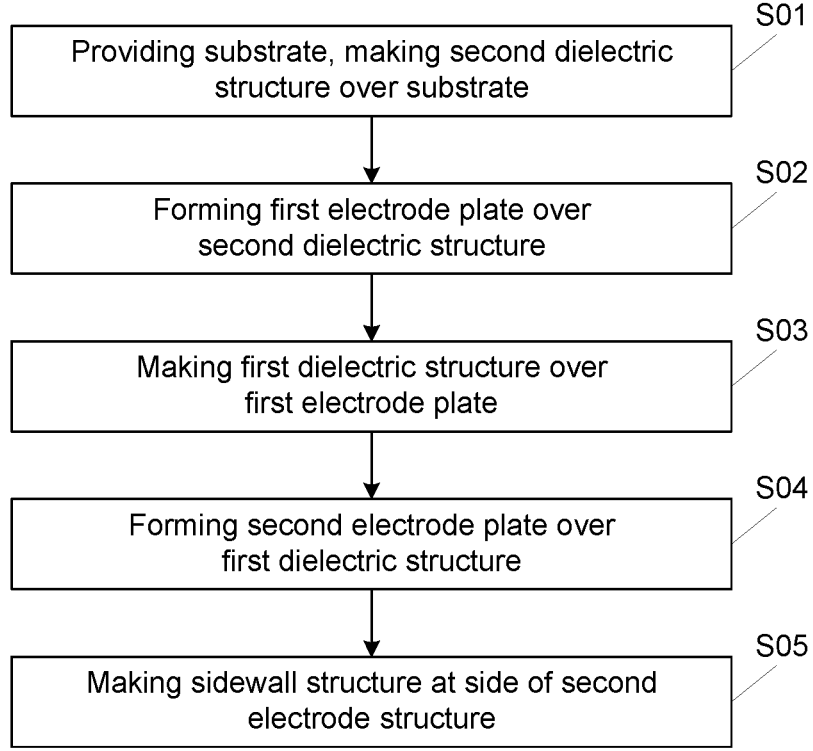
FIG. 9 illustrates an exemplary method for forming a semiconductor structure according to various disclosed embodiments of the present disclosure.

FIG. 9 shows a schematic flow chart to illustrate methods for forming a semiconductor structure according to the present disclosure. The exemplary semiconductor structure may be used to make capacitively coupled digital isolators. At S01, a substrate is provided for fabricating the semiconductor structure. The substrate may contain a semiconductor material such as single crystalline silicon. The substrate includes an isolation region and a device region. Isolation structures may be formed in the isolation region. Certain devices such as metal-oxide-semiconductor field-effect transistors (MOSFETs) may be made in the device region. Further, a second dielectric structure (e.g., the second dielectric structure 205 as shown in FIG. 2) may be formed over the isolation and device regions in the substrate. In some cases, the second dielectric structure may be a dielectric layer deposited with dielectric materials.

At S02, a first electrode plate and a first metal layer may be formed, for example, by deposition, over the second dielectric structure, respectively (e.g., the first electrode plate 206 and first metal layer 220 as shown in FIG. 2). The first electrode plate and first metal layer are parallel to the substrate and contain an electrically conductive material such as metal. The first electrode plate and first metal layer may be made by the same process concurrently.

At S03, a first dielectric structure (e.g., the first dielectric structure 207 as shown in FIG. 3) is formed over the first electrode plate and first metal layer. The first dielectric structure covers the first electrode plate and first metal layer, and may be made by depositing dielectric materials that form a dielectric layer.

At S04, a second electrode plate and second metal layer (e.g., the second electrode plate 208 and second metal layer 221 as shown in FIG. 3) are fabricated over the first dielectric structure. The second electrode plate and second metal layer may be formed by a deposition method, and may be made optionally by the same process simultaneously. The second electrode plate is formed above the first electrode plate, while the second metal layer is configured above the first metal layer. The first and second electrode plates, separated by the first dielectric structure, are parallel to each other and aligned in a direction perpendicular to the substrate. As such, the projected areas of the first and second electrode plates on the substrate may partially or completely overlap. In some embodiments, the thickness of the second electrode plate is larger than that of the first electrode plate by a certain value. In some cases, the width and length of the second electrode plate are larger than those of the first electrode plate by certain predetermined values, respectively. During the processes illustrated above, electrical interconnection structures (e.g., plugs and vias) may be made that connect the devices in the device region with the first and second metal layers, respectively.

At S05, a dielectric sidewall structure is made on the sides of the second electrode plate. The sidewall structure may include an adhesive layer and one or more dielectric layers. The sidewall structure may be made by a deposition process and be attached to the sides of the second electrode plate. The adhesive layer is optional and contains a dielectric material. The adhesive layer may be deposited over the top and side surfaces of the second electrode plate and second metal layer, followed by deposition of the one or more dielectric layers on the adhesive layer (e.g., the adhesive layer 215 and first to third dielectric layers 216-218 as shown in FIG. 7). The adhesive layer and one or more dielectric layers form the sidewall structure at the side region of the second electrode plate.

Optionally, when the sidewall structure contain a single dielectric layer, the corresponding dielectric constant may decrease gradually or with a predetermined pattern along a direction away from the second electrode plate and parallel to the substrate. Optionally, when the sidewall structure contain multiple dielectric layers, the corresponding dielectric constant in the layers may decrease gradually, with a step pattern, or with another pattern along a direction away from the second electrode plate and parallel to the substrate. Part of the layers of the sidewall structure is parallel to the side surface of the second electrode plate. In some cases, the sidewall structure may cover the side of the second electrode plate completely, while covering the top surface of the second electrode plate partially (e.g., the layer 209 as shown in FIG. 6). Optionally, the sidewall structure may cover the side of the second electrode plate partially, e.g., without covering the top part of the side of the second electrode plate (e.g., the layer 309 as shown in FIG. 8). As such, the sidewall structure may cover the side of the second electrode plate at least partially. Thereafter, a passivation layer may be deposited over the sidewall structure. The dielectric constant of the sidewall structure is larger than that of the passivation layer. Because of the sidewall structure, the distribution of the electrical field intensity is adjusted. The high electrical field intensity may be reduced and the breakdown voltage may be increased.

Optionally in above descriptions, a deposition process may be performed by chemical vapor deposition (CVD), physical vapor deposition (PVD), or atomic layer deposition (ALD). Layered structures such as metal layers, dielectric layers, and dielectric structures may be formed and trenches and openings may be filled by CVD, PVD, and/or ALD.

Compared with the existing technologies, the above-illustrated embodiments of the present disclosure have the following advantages.

In accordance with the present disclosure, a sidewall structure is formed at the side of the second electrode plate. The dielectric constant of the sidewall structure is distributed in a gradient. Further, a passivation layer is grown on the sidewall structure and the first dielectric structure. The dielectric constant of the sidewall structure is greater than that of the passivation layer. The electrical field intensity in the dielectric material at the edge of the second electrode plate is distributed according to the dielectric constant of the dielectric material. That is, the product of the electrical field intensity and the dielectric constant in the sidewall structure is equal to that in the passivation layer. As the dielectric constant of the sidewall structure is greater than that of the passivation layer, the electrical field intensity in the sidewall structure is smaller than that in the passivation layer. Therefore, the high electrical field intensity at the side of the second electrode plate may be effectively weakened. The risk of breakdown at the side of the second electrode plate may be reduced.

Further, the sidewall structure may include several dielectric layers, and the dielectric constant of the dielectric layers decreases layer by layer from the surface of the second electrode plate to the surface of the passivation layer. The product of the electrical field intensity and the dielectric constant in any dielectric layer of the sidewall structure is equal. The dielectric constant of the dielectric layers of the sidewall structure decreases sequentially. Thus, in the direction away from the side of the second electrode plate, the electrical field intensity in the dielectric layers increases sequentially. By adjusting the gradient change of the dielectric properties of the dielectric layers, the distribution of the electrical field intensity at the side of the capacitive electrode plate may be adjusted precisely. The relatively high electrical field intensity at the side of the electrode plate of the capacitor structure may be decreased. Weak points for withstanding high voltage at the side of the electrode plate of the capacitor structure may be eliminated. The overall capability of the capacitive isolators to withstand high voltage may be improved.

Further, the sidewall structure may include a single dielectric layer. The dielectric constant of the dielectric layer gradually decreases from the surface of the second electrode plate to the surface of the passivation layer. Thus, in the direction away from the side of the second electrode plate, the electrical field intensity in the single dielectric layer increases gradually. By adjusting the gradient change of the dielectric property of the single dielectric layer, the distribution of the electrical field intensity at the side of the capacitive electrode plate may be adjusted precisely. The relatively high electrical field intensity at the side of the electrode plate of the capacitor structure may be decreased. Weak points for withstanding high voltage on the side of the electrode plate of the capacitor structure may be eliminated. The overall capability of the capacitive isolators to withstand high voltage may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
a substrate;
a first electrode plate over the substrate;
a second electrode plate over, parallel to, and aligned in a first direction perpendicular to the substrate with the first electrode plate; and
a sidewall structure attached to a side surface of the second electrode plate, a dielectric constant of the sidewall structure decreasing in a second direction away from the second electrode plate, and a topmost surface of the sidewall structure being lower than a top surface of the second electrode plate.

2. The structure according to claim 1, wherein the sidewall structure includes a plurality of dielectric layers, and a dielectric constant of the plurality of dielectric layers decreases layer by layer along the second direction.

3. The structure according to claim 1, wherein the sidewall structure includes a dielectric layer, and a dielectric constant of the dielectric layer decreases along the second direction.

4. The structure according to claim 1, further comprising:
a first dielectric structure between the first and second electrode plates; and
a second dielectric structure between the first electrode plate and the substrate.

5. The structure according to claim 1, wherein the second electrode plate is thicker than the first electrode plate, and the first and second electrode plates are over an isolation region of the substrate.

6. The structure according to claim 1, wherein the sidewall structure includes
a first part attached to a portion of the side surface of the second electrode plate, and
a second part connected to the first part and extending along the second direction over the substrate.

7. The structure according to claim 6, wherein
the first part of the sidewall structure attached to the side surface of the second electrode plate has a height greater than or equal to half a thickness of the second electrode plate along the first direction; and
an extension length of the second part of the sidewall structure along the second direction is greater than or equal to twice the thickness of the second electrode plate.

8. A method for forming a semiconductor structure, comprising:
providing a substrate;
forming a first electrode plate over the substrate;
forming a second electrode plate over the first electrode plate, the second electrode plate parallel to and aligned in a first direction perpendicular to the substrate with the first electrode plate; and
forming a sidewall structure, the sidewall structure attached to a side of the second electrode plate, a dielectric constant of the sidewall structure decreasing in a second direction away from the second electrode plate, and a topmost surface of the sidewall structure being lower than a top surface of the second electrode plate.

9. The method according to claim 8, wherein forming the sidewall structure comprises forming a plurality of dielectric layers, and a dielectric constant of the plurality of dielectric layers decreases layer by layer along the second direction.

10. The method according to claim 8, wherein forming the sidewall structure comprises forming a dielectric layer, and a dielectric constant of the dielectric layer decreases along the second direction.

11. The method according to claim 8, further comprising:
   before forming the second electrode plate, forming a first dielectric structure over the first electrode plate.

12. The method according to claim 11, further comprising:
   before forming the first electrode plate, forming a second dielectric structure over the substrate.

13. The method according to claim 8, wherein the second electrode plate is thicker than the first electrode plate, and the first and second electrode plates are over an isolation region of the substrate.

14. The method according to claim 8, wherein the sidewall structure includes
   a first part attached to a portion of the side surface of the second electrode plate, and a second part connected to the first part and extending along the second direction over the substrate, wherein
   the first part has a height greater than or equal to half a thickness of the second electrode plate along the first direction; and
   an extension length of the second part along the second direction is greater than or equal to twice the thickness of the second electrode plate.

15. A semiconductor structure, comprising:
   a substrate;
   a first electrode plate over the substrate;
   a second electrode plate over, parallel to, and aligned in a first direction perpendicular to the substrate with the first electrode plate; and a sidewall structure attached to a side surface of the second electrode plate, wherein a topmost surface of the sidewall structure being lower than a top surface of the second electrode plate.

16. The structure according to claim 15, wherein a dielectric constant of the sidewall structure decreases in a second direction away from the second electrode plate.

17. The structure according to claim 15, wherein the second electrode plate is thicker than the first electrode plate, and the first and second electrode plates are over an isolation region of the substrate.

18. The structure according to claim 15, further comprising:
   a first dielectric structure between the first and second electrode plates; and
   a second dielectric structure between the first electrode plate and the substrate.

19. The structure according to claim 15, wherein the sidewall structure includes
   a first part attached to a portion of the side surface of the second electrode plate, and
   a second part connected to the first part and extending along the second direction over the substrate.

20. The structure according to claim 19, wherein
   the first part of the sidewall structure attached to the side surface of the second electrode plate has a height greater than or equal to half a thickness of the second electrode plate along the first direction; and
   an extension length of the second part of the sidewall structure along the second direction is greater than or equal to twice the thickness of the second electrode plate.

* * * * *